United States Patent
Chen

(10) Patent No.: US 7,447,021 B2
(45) Date of Patent: Nov. 4, 2008

(54) AIR GUIDING COVER

(75) Inventor: Chin-Hui Chen, Shenzhen (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 373 days.

(21) Appl. No.: 11/306,592

(22) Filed: Jan. 4, 2006

(65) Prior Publication Data

US 2006/0274498 A1  Dec. 7, 2006

(30) Foreign Application Priority Data

Jun. 4, 2005  (CN) .................. 2005 1 0035154

(51) Int. Cl.
 *H05K 7/20* (2006.01)
(52) U.S. Cl. .................. 361/695; 361/690; 361/687; 361/694; 454/186
(58) Field of Classification Search ................ 361/687, 361/690, 694, 695; 454/186
See application file for complete search history.

(56) References Cited

U.S. PATENT DOCUMENTS

| | | | | |
|---|---|---|---|---|
| 5,297,005 A | * | 3/1994 | Gourdine | 361/697 |
| 5,422,787 A | * | 6/1995 | Gourdine | 361/697 |
| 5,597,035 A | * | 1/1997 | Smith et al. | 165/80.3 |
| 5,630,469 A | * | 5/1997 | Butterbaugh et al. | 165/80.3 |
| 5,704,212 A | * | 1/1998 | Erler et al. | 62/3.2 |
| 5,946,190 A | * | 8/1999 | Patel et al. | 361/700 |
| 5,963,424 A | * | 10/1999 | Hileman et al. | 361/695 |
| 6,437,979 B1 | * | 8/2002 | Unrein | 361/687 |
| 6,639,799 B2 | | 10/2003 | Prasher et al. | |
| 6,940,716 B1 | * | 9/2005 | Korinsky et al. | 361/695 |
| 6,980,427 B2 | * | 12/2005 | Garnett et al. | 361/685 |
| 7,002,797 B1 | * | 2/2006 | Wittig | 361/695 |
| 7,180,740 B2 | * | 2/2007 | Li et al. | 361/697 |
| 2002/0054479 A1 | * | 5/2002 | Wu | 361/695 |
| 2003/0016491 A1 | * | 1/2003 | Frame et al. | 361/683 |
| 2003/0030977 A1 | * | 2/2003 | Garnett et al. | 361/687 |
| 2003/0076652 A1 | * | 4/2003 | Ahn | 361/687 |
| 2003/0155106 A1 | * | 8/2003 | Malone et al. | 165/121 |
| 2003/0184961 A1 | * | 10/2003 | Ahn | 361/683 |
| 2003/0202326 A1 | * | 10/2003 | Toh | 361/690 |
| 2003/0218850 A1 | * | 11/2003 | Kubo et al. | 361/103 |
| 2004/0130867 A1 | * | 7/2004 | Huettner et al. | 361/687 |
| 2004/0240175 A1 | * | 12/2004 | Brovald et al. | 361/687 |
| 2005/0041392 A1 | * | 2/2005 | Chen | 361/695 |
| 2005/0270740 A1 | * | 12/2005 | Tai et al. | 361/690 |

FOREIGN PATENT DOCUMENTS

CN  2530080 Y  1/2003

* cited by examiner

*Primary Examiner*—Anatoly Vortman
(74) *Attorney, Agent, or Firm*—Winston Hsu

(57) ABSTRACT

An air conducting cover for a server includes a recess portion, a guiding portion, and a connecting portion. The guiding portion upwardly and outwardly extends from an end of the recess portion. The connecting portion horizontally extends from an end of the guiding portion and is attached to the server. The server includes a server motherboard bracket and a server motherboard installed on the server motherboard bracket. The air conducting cover is disposed on the server motherboard bracket and combined with the server motherboard bracket as an airflow channel. The airflow channel is a diverging duct and gradually narrowed from two ends to a middle. Thus, a blowing speed of a cooling air insufflated into the server is accelerated. The air conducting cover can improve heat dissipation efficiency of the server without additional room and will not produce more noise.

11 Claims, 3 Drawing Sheets

AIR GUIDING COVER

FIELD OF THE INVENTION

The present invention relates to an air guiding cover, and particularly to an air guiding cover that can improve heat dissipation efficiency for a server.

DESCRIPTION OF RELATED ART

A server is a core computer for serving every computers in a network system. The server can provide a variety of functions for network users, such as printing, copying, storage, and sharing information and sources among the network users in the network system. A structure of the server is similar to a personal computer. The server includes a central processing unit (CPU), a memory, a north bridge chip, a south bridge chip, input devices, output devices, and etc. The north bridge chip is connected with the CPU and the memory. The south bridge chip is connected with input devices and output devices. A chassis of the server may be a tower chassis, a bracket chassis or a blade chassis.

A blade server includes several motherboards and a blade chassis. One blade chassis can take in a lot of motherboards. Each motherboard is an independent system, which has a CPU, a memory, a hard disc, and other electronic components. A power supply, a storage service, and network connections between motherboards are provided by a backboard. Thus the blade server can save a lot of room, but resulting in a serious heating problem. The blade server has a heat dissipation system. A conventional heat dissipation system includes a cooling fan and a heat sink. However, as the blade server develops, heat generated therefrom is getting larger and larger. Because a large number of motherboards are placed in one blade chassis, room for heat dissipation is limited. The cooling fan will produce larger noises if improving its efficiency.

What is needed, therefore, is an air guiding cover that can improve heat dissipation efficiency for a server without additional room and producing more noise.

SUMMARY OF THE INVENTION

An air guiding cover for a server in accordance with a preferred embodiment includes a recess portion, a guiding portion, and a connecting portion. The guiding portion upwardly and outward extends from an end of the recess portion. The connecting portion horizontally extends from an end of the guiding portion and is attached to the server. The server comprises a server motherboard bracket and a server motherboard installed on the server motherboard bracket. The air guiding cover is disposed on the server motherboard bracket and combined with the server motherboard bracket as an airflow channel. The airflow channel is a diverging duct and gradually narrowed from two ends to a middle. Thus, a blowing speed of a cooling air insufflated into the server is accelerated. So, the air guiding cover can improve heat dissipation efficiency of the server without additional room and producing more noise.

Other advantages and novel features will become more apparent from the following detailed description when taken in conjunction with the accompanying drawings, in which:

DETAILED DESCRIPTION

Figure 1:
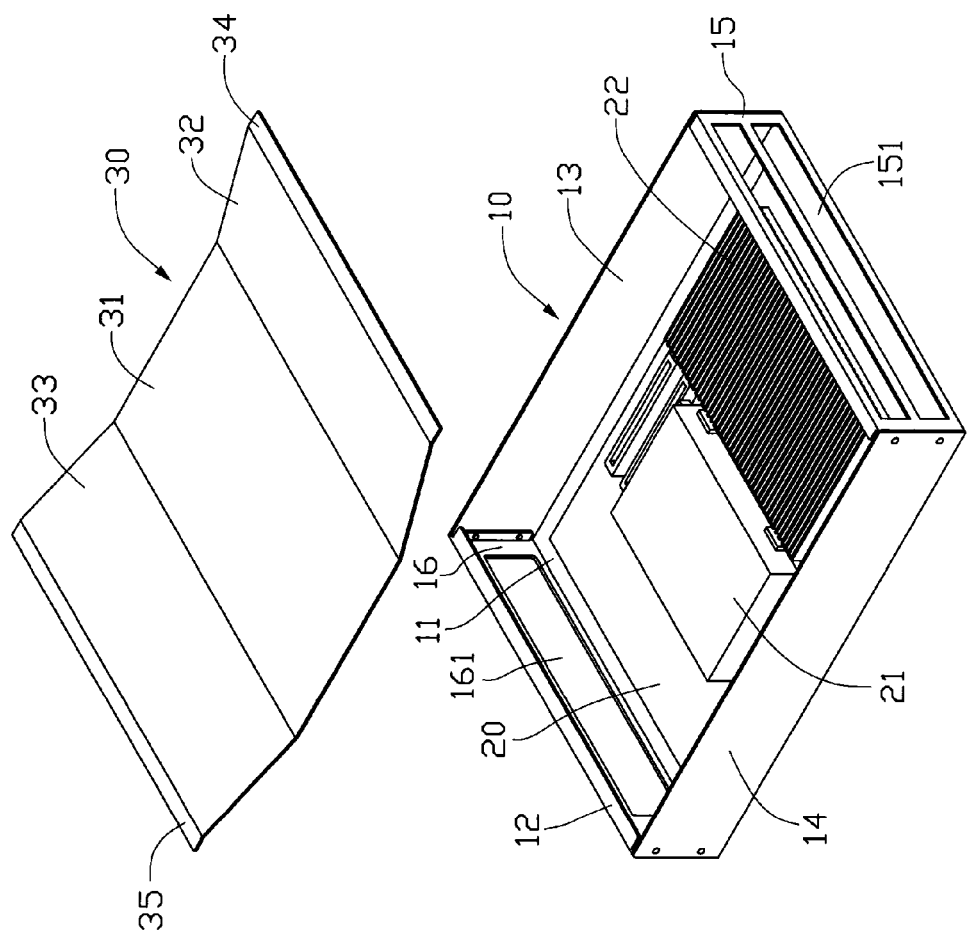
FIG 1 is an isometric view of an air guiding cover in accordance with a preferred embodiment of the present invention, and a server.

Referring to FIG 1, an air guiding cover 30 for a server in accordance with the preferred embodiment of the present invention is shown. The server includes a server motherboard bracket 10 and a server motherboard 20.

The server motherboard bracket 10 includes a bottom plate 11, a front baffle plate 13, a back baffle plate 14, a right sidewall 15, a left sidewall 16, and two hems 12. The hems 12 perpendicularly inwardly extend from top portions of the right sidewall 15 and the left sidewall 16 respectively. An air inlet 151 is defined in the right sidewall 15, and an air outlet 161 is defined in the left sidewall 16.

The server motherboard 20 is fixed on the bottom plate 11 of the server motherboard bracket 10. The server motherboard 20 includes a plurality of electronic components such as a hard disc 21 and a heat sink 22. The heat sink 22 is in the vicinity of the air inlet 151. A cooling air is insufflated into the server from the air inlet 151, passes through the heat sink 22, and is discharged out of the server from the air outlet 161.

The air guiding cover 30 includes a recess portion 31, a first guiding portion 32 and a second guiding portion 33. The first guiding portion 32 and the second guiding portion 33 upwardly and outwardly extend from two opposite ends of the recess portion 31 respectively. A first connecting portion 34 and a second connecting portion 35 respectively horizontally extend from upper ends of the first guiding portion 32 and the second guiding portion 33.

Figure 2:
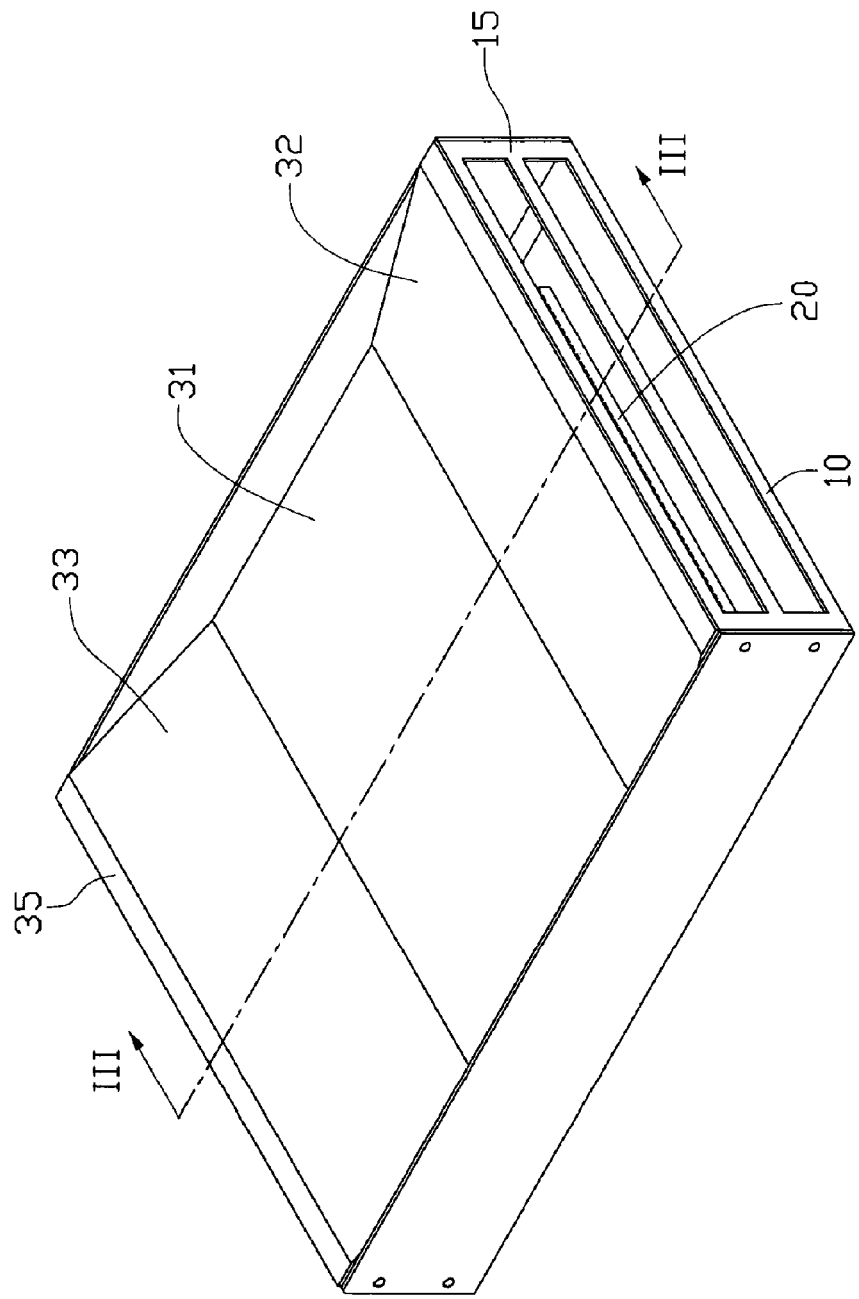
FIG. 2 is an assembled view of FIG. 1.
Figure 3:
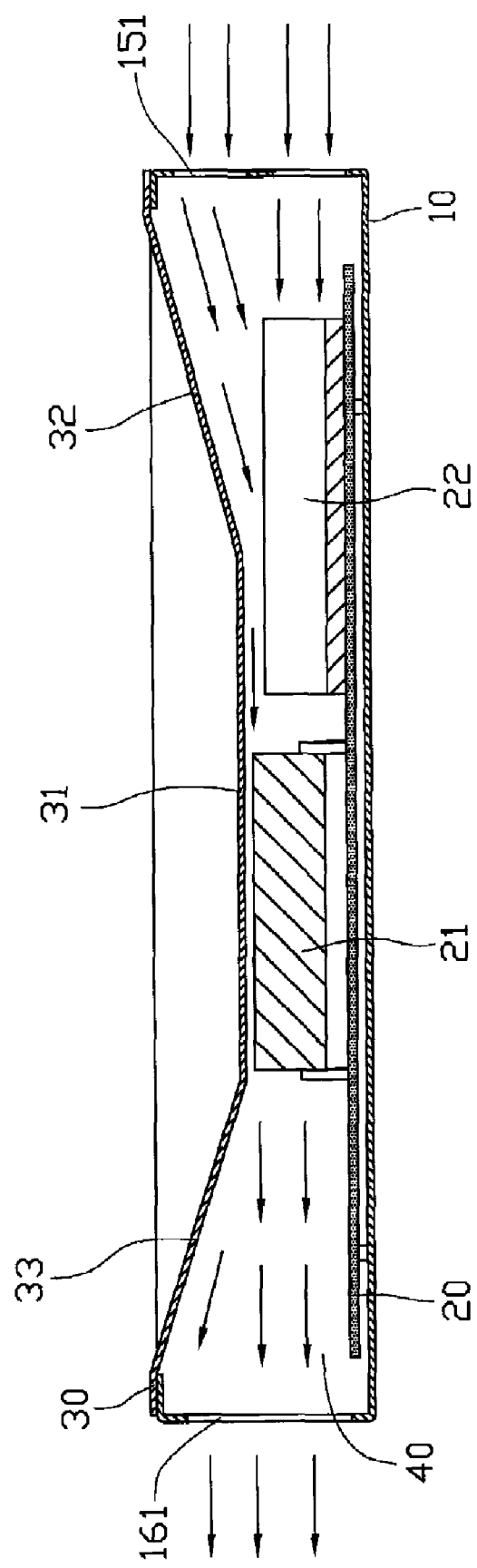
FIG. 3 is a cross sectional view taken along line III-III of FIG. 2.

Referring also to FIGS. 2 and 3, the air guiding cover 30 is placed on the server motherboard bracket 10 and combined with the server motherboard bracket 10 as an airflow channel 40. The first connecting portion 34 and the second connecting portion 35 of the air guiding cover 30 are attached to the hems 12 of the server motherboard bracket 10 by conventional means such as screws and glue water. The recess portion 31, the first guiding portion 32, and the second guiding portion 33 of the air guiding cover 30 are disposed in the server motherboard bracket 10, and the recess portion 31 is in the vicinity of a top portion of the electronic components. The airflow channel 40 is enclosed by the air guiding cover 30, the air inlet 151, the air outlet 161, and the recess portion 11. The airflow channel 40 is a diverging duct and gradually narrowed from two ends to a middle thereof.

When the server is working, the electronic components on the server motherboard 20 will generate a large amount of heat. The cooling air is insufflated into the server from the air inlet 151. Because the airflow channel 40 is gradually narrowed from two ends to a middle, a cross sectional area of the airflow channel 40 on the electronic components is reduced. Thus, a blowing speed of the cooling air is accelerated. At the same time, because the air guiding cover 30 covers the server motherboard bracket 10, the cooling air is centralized to blow over the electronic components and the heat sink 221. Thus, the air guiding cover 30 can improve heat dissipation efficiency for the server without additional room and more noise.

The air guiding cover 30 maybe have another structure, for example, only one guiding portion upwardly and outward extends from an end of the recess portion 31.

Proved by experiments, when adding the air guiding cover 30 into the server, a temperature of each of the electronic components is reduced.

A temperature correlation table is given as follows:

| Electronic components | Temperature (° C.) Without air conducting cover | Temperature (° C.) With air conducting cover | Temperature requirement (° C.) |
|---|---|---|---|
| CPU | 90.8 | 77.2 | <100 |
| North Bridge Chip | 93.6 | 78.0 | <105 |
| South Bridge Chip | 209.8 | 100.4 | <105 |
| Memory | 135.3 | 61.8 | — |

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An air guiding cover for a server, the air guiding cover comprising:
   a recess portion;
   a guiding portion upwardly and outwardly extending from an end of the recess portion; and
   a connecting portion horizontally extending from an end of the guiding portion, the connecting portion attached to the server, the air guiding cover combined with the server as an airflow channel, the airflow channel being gradually narrowed from an end to a middle thereof, to accelerate blowing speed of air, wherein the server comprises a server motherboard bracket comprising two sidewalls, an air inlet and an air outlet are defined in the sidewalls respectively, two hems perpendicularly inwardly extending from top portions of the two sidewalls respectively, and the connecting portion of the air guiding cover is attached to one of the hems.

2. The air guiding cover as claimed in claim 1, wherein
   the server motherboard bracket further comprises a bottom plate; and
   the server further comprises a server motherboard installed on the bottom plate of the server motherboard bracket, the server motherboard comprising a plurality of electronic components and a heat sink thereon.

3. The air guiding cover as claimed in claim 1, wherein the airflow channel is enclosed by the air guiding cover, the air inlet, the air outlet, and the recess portion.

4. The air guiding cover as claimed in claim 2, wherein the recess portion is in the vicinity of a top portion of the electronic components.

5. A server comprising:
   a server motherboard bracket comprising two opposite sidewalls, and an air inlet and an air outlet defined in the sidewalls respectively;
   a server motherboard fixed in the server motherboard bracket, the server motherboard comprising a plurality of electronic components and a heat sink; and
   an air guiding cover covering the whole server motherboard bracket, the air guiding cover comprising a recess portion, two guiding portions upwardly and outwardly extending from two opposite ends of the recess portion, and two connecting portions extending from free ends of the guiding portions respectively, wherein the connecting portions are attached to the server motherboard bracket at the air inlet and the air outlet, respectively.

6. The server as claimed in claim 5, wherein two hems perpendicularly inwardly extending from top portions of the sidewalls, and at least one of the connecting portions of the air guiding cover is attached to a corresponding one of the hems.

7. The server as claimed in claim 6, wherein an airflow channel is enclosed by the air guiding cover, the air inlet, the air outlet, and the recess portion.

8. The server as claimed in claim 7, wherein the airflow channel is a diverging duct and gradually narrowed from two ends to a middle.

9. The server as claimed in claim 5, wherein the recess portion is in the vicinity of a top portion of the electronic components.

10. A server comprising:
    a bracket comprising two opposite sidewalls and a bottom plate, and an air inlet and an air outlet defined in the sidewalls respectively;
    a server motherboard fixed in a middle portion of the bracket, the server motherboard comprising a plurality of electronic components; and
    an air guiding cover covering the bracket with two free ends being attached to the bracket above the air inlet and the air outlet respectively, an airflow channel formed among the air guiding cover, the air inlet, the air outlet, and the bottom plate, wherein the airflow channel is gradually narrowed from at least one end to a middle thereof, and a space is formed between the air guiding cover and the top surfaces of the electronic components to allow airflow passing therethrough.

11. The server as claimed in claim 10, wherein the air guiding cover comprises a recess portion, at least one guiding portion upwardly and outwardly extending form an end of the recess portion, and a connecting portion horizontally extending from an end of the guiding portion to be attached to the server above the air inlet or the air outlet.

* * * * *